(12) United States Patent
Chung et al.

(10) Patent No.: US 6,677,996 B1
(45) Date of Patent: Jan. 13, 2004

(54) REAL TIME CAMERA EXPOSURE CONTROL

(75) Inventors: Randall M. Chung, Laguna Niguel, CA (US); Paul K. Kim, Torrance, CA (US); Wei Feng, Irvine, CA (US)

(73) Assignee: Pictos Technologies, Inc., Newport Beach, CA (US)

( * ) Notice: Subject to any disclaimer, the term of this patent is extended or adjusted under 35 U.S.C. 154(b) by 0 days.

(21) Appl. No.: 09/295,699

(22) Filed: Apr. 21, 1999

(51) Int. Cl.[7] .......................... H04N 3/14; H04N 5/335; H04N 5/217; H01L 27/00
(52) U.S. Cl. ...................... 348/308; 348/301; 348/241; 250/208.1
(58) Field of Search ................................ 348/308, 301, 348/241; 250/208.1

(56) References Cited

U.S. PATENT DOCUMENTS

| | | | | |
|---|---|---|---|---|
| 5,923,369 A | * | 7/1999 | Merrill et al. | 348/301 |
| 5,953,060 A | * | 9/1999 | Dierickx | 348/241 |
| 6,194,696 B1 | * | 2/2001 | Fossum et al. | 250/208.1 |
| 6,255,638 B1 | * | 7/2001 | Eraluoto et al. | 250/208.1 |
| 6,377,303 B2 | * | 4/2002 | O'Connor | 348/308 |
| 6,388,242 B1 | * | 5/2002 | Bock | 250/208.1 |
| 2001/0010551 A1 | * | 8/2001 | Dierickx | 348/241 |
| 2001/0052941 A1 | * | 12/2001 | Matsunaga et al. | 348/308 |

* cited by examiner

Primary Examiner—Wendy R. Garber
Assistant Examiner—James Hannett
(74) Attorney, Agent, or Firm—Christopher J. Rourk; Akin Gump Strauss Hauer & Feld, LLP

(57) ABSTRACT

The present invention discloses an electronic camera which processes the exposure of light by means of an imaging surface comprising a plurality of active pixel sensor circuits. Each pixel sensor circuit produces a small current inversely proportional to the amount of light that has fallen on a photodiode within the pixel sensor circuit. The individual currents produced by the active pixel sensor circuits are aggregated onto one or more current collection busses and operatively channeled to an operational amplifier assigned to a given bus. If a single operational amplifier is used, its output voltage is compared to a preset voltage level. When the voltage level decays to a preset level, a control signal is signaled. The control signal may be used to terminate further light exposure through traditional means such as triggering a "snubber" tube which immediately discharges the flash tube storage capacitor or turning off an IGBT high power transistor controlling the current through the flash tube, or, it may trigger an electronic shutter which prevents further photographic development of the imaging surface. Through the use of multiple operational amplifiers, different sectors of the imaging surface can be "weighted," thereby giving greater effect to the light falling on select portions of the imaging surface.

19 Claims, 5 Drawing Sheets

REAL TIME CAMERA EXPOSURE CONTROL

BACKGROUND OF THE INVENTION

1. Field of the Invention

This invention relates to an electronic camera, and more particularly, to a circuit for regulating the amount of light falling upon the image field to optimize picture quality.

2. Description of Related Art

The quality of a photograph, whether produced by standard film based cameras or electronic cameras, is dependant on the amount of light that falls upon the imaging surface. Too much light or too little light will degrade the quality of a picture. Because background light is easily measured in daylight, regulating the shutter speed and other factors affecting the amount of light entering the aperture is not generally difficult in natural light pictures. The problem becomes more challenging when background light is insufficient to photograph an object, and an electronic flash must be used. There is no background light to measure when pointing a camera toward the darkness. Past methods for regulating film exposure in flash situations have involved calculations which considered the distance from the camera to the object, the reflectivity of the object being photographed and the intensity of the flash. These factors theoretically allow a photographer to prepare the camera settings so as to optimize a picture. The process was a cumbersome one and usually involved more than a little guesswork.

AS advances were made in flash photography, the single use flash bulb was replaced by a reusable light source, often referred to as a "strobe" owing to its short cycle and rapid rise and fall in luminescence. Because strobes were reusable, the flash duration was not determined by when the bulb "burned out" (as with traditional flash bulbs), but by control circuitry establishing a duration for the flash. More sophisticated control circuitry allowed for a variable duration of the strobe flash. By controlling the duration of the "on" period of the strobe, the total light output could be controlled.

This did not, however, eliminate the need to calculate the distance from the object and its reflectivity to determine the proper duration for the flash. In order to avoid these calculations, circuitry was developed wherein a photocell measured the amount of light reflected back onto the camera during the actual flash. Through use of a high speed comparator circuit, this reflected light was compared to an optimum preset figure. After the optimum amount of light had been received, the strobe was turned off through any one of several circuit designs. One means was to trigger a "snubber" tube which immediately discharged the flash tube storage capacitor. Another means was to turn off an IGBT high power transistor controlling the current through the flash tube. Although these systems measured the flash in real time, noteworthy shortcomings inhered in their implementation. The photocell circuitry increased the cost, complexity, size, weight, and power consumption of a flash camera. Moreover, controlling the flash duration by discharging the energy stored in the storage capacitor was inimical to another important goal of flash cameras—extending the life of a flash battery between chargings by minimizing power consumption.

These problems led to the development of a two-flash system. This process involves a flash unit that takes two flashes in quick succession. The "control flash" occurs first, at a low intensity flash perhaps 10% of the power which will be discharged in the subsequent "imaging flash". The reflected light of the control flash is analyzed by the camera's microprocessor which automatically adjusts one or more of the camera's parameters (aperture, flash duration, etc.), so as to optimize settings for the forthcoming imaging flash. In a typical through the lens camera, the sample light from the control flash is analyzed after following the same path that the imaging flash will travel. For this reason, two-flash systems are particularly useful in situations which use a zoom or macro lens, or a filter. Although some of the separate photocell circuitry could be eliminated, or reduced, fairly complex calculating and control mechanisms remained. Moreover, any advantages realized by the two-flash system must be balanced against a whole new set of disadvantages. A two-flash system wastes unnecessary energy from the battery as a result of the first flash. There is also the added cost and complexity of designing and installing a flash unit that can be flashed twice in rapid succession. These complexities are not limited to the twoflash unit itself, but extend to conventional "slave" flash units which are stacked or added for additional luminosity. Because conventional slave units are typically triggered along with the first flash of a two-flash unit, specially designed slave units must be used which synchronize the flash of the slave unit with the second flash of the two-flash unit.

Multiple user disadvantages also commonly inhere in the two-flash units. First, photo subjects often blink after the first flash, resulting in a photograph with someone's eyes closed by the time the second flash occurs. Moreover, it is not uncommon for a camera owner to ask a friend or even passers-by to take a photo of him. Typically, the passer-by will be unfamiliar with a two-flash camera, or unaware that the camera operates on that principle. As a result, he will typically move after the first flash has occurred. By the time the second flash occurs, the camera may be sweeping through and arc (resulting in a blurred picture), or pointing toward the sidewalk. The result is a lost opportunity to capture a fleeting memory and a waste of film.

Because of the disadvantages which inhere in two-flash systems, a workable real-time means of measuring light is preferable. The basic digital camera works by a process of sampling pixels and measuring voltage levels. A photo diode represents a single pixel on a CMOS imager (the imaging surface of an electronic camera). The CMOS imager comprises a matrix of pixels, perhaps a thousand by a thousand. As the photodiode within a pixel is exposed to light, the voltage potential $V_{PD}$ across the photodiode progressively decays toward zero. $V_{PD}$ is therefore inversely proportional to the total amount of light which has fallen on the photo diode. The voltage across the photo diode at the end of the integration phase (the light collecting period when the picture is taken) will determine the brightness or darkness of that particular pixel. Typically, an electronic camera will utilize a photocell to measure an aggregate amount of light falling on it, and trigger a control signal at the appropriate time. The control signal is used to terminate the light exposure to the CMOS imager, either through methods already discussed such as "snubbers" or through more recently developed electronic methods.

FIG. 1 discloses a schematic of a conventional three-transistor imager circuit. The image processing starts with the reset phase. DC cell 13, typically comprising a voltage from 3.3 to 0.5 volts, drops to ground 15 across a reset-transistor and a photo diode 14. Initially, no voltage is applied to the gate 6 of the reset ransistor 4, and the junction from the drain 8 to the source 10 of the reset transistor acts as an open circuit. As a result, the entire voltage from the DC cell 13 drops entirely across the transistor 4 from the source 10 to the drain 8, represented by $V_{SD1}$. At this time, the voltage drop $V_{PD1}$ 34 across the photo diode 14 is effectively zero (or whatever charge might remain from the previous photograph). In the second step, a pulse on the reset-transistor gate 6 at a voltage level sufficient to gate the reset-transistor 4 reduces the voltage drop $V_{SD1}$ across the reset transistor 4 to the threshold voltage $V_t$ of the transistor, (typically about 0.5 volts). The voltage drop across the photo diode $V_{PD1}$ 34 thereby becomes the potential of the DC cell 13, minus the slight drop across the reset transistor. For example, a cell voltage of 5 volts minus a threshold voltage of 0.5 volts results in a of 4.5 volt charge on the photodiode 14.

In the third step, the reset pulse to the gate 6 is terminated. However, because of an inherent capacitance of a photo diode, the photodiode 14 will retain this fixed charge for a period of time after the reset pulse ceases.

The next step is the integration phase—the exposure of light onto the CMOS imager. In this process, each photo-diode 14 of each pixel is exposed to light. As a result of photon bombardment, the potential at the cathode 19 drains toward ground 15, until the cathode potential (or voltage across the photo diode) $V_{PD1}$ approaches zero. The voltage potential $V_{PD1}$ 34 is therefore inversely proportional to the total light that has fallen on the photodiode 14 from the moment the reset pulse terminated. Therefore, starting from a fixed charge on the cathode 19 of the photodiode 14 as a result of the reset pulse, the voltage $V_{PD1}$ 34 decays through photon bombardment until it reaches a preset level. The voltage potential $V_{PD1}$ 34 determines the brightness of that particular pixel in the eventual picture. One of the problems in measuring the voltage $V_{PD1}$ 34 is its small capacitance. If the voltage potential 34 on the cathode 19 of the photodiode 14 were switched directly onto the voltage sensing bus 32, the relative capacitance of the photodiode is so much smaller that it would effectively discharge into the bus, substantially degrading its voltage potential. For this reason, the conventional three transistor imaging circuit interposes a buffering transistor 24 between the cathode and any voltage sensing bus. To prevent the photodiode from discharging through the gate of the transistor, one of the important properties on the buffering transistor must be an extremely high gate resistance, holding the gate current to effectively zero amperes. Because the traditional bi-polar transistor allows a gate current, it is not suited for this application. The field effect transistor has an almost infinite gate resistance, and is therefore typically utilized in a conventional three-transistor imager circuit.

The buffering transistor 24 prevents any actual current flow from the cathode 19 of the photo diode 14 to the voltage sensing bus 32. The actual charging of the bus 32 occurs as the charge stored in the DC cell 13 passes through the selecting transistor 16, and through the buffering transistor 24 to the voltage sensing bus 32. This path is hereinafter referred to as the "primary signal path" or "primary current path" of the three transistor imager circuit, both in the prior art, and in the invention disclosed herein. Current through this path is represented by the symbol $I_D$.

This process begins when a signal from row selection bus 12 energizes gate 18 of the selecting transistor 16. Raising the gate voltage of the selecting transistor 16 to the voltage provided by DC cell 13 reduces the voltage drop $V_{SD2}$ between the source 22 and the drain 20 to the threshold voltage $V_t$ of the transistor. The voltage potential at the drain 28 of the buffering transistor 24 thus becomes the potential of the DC cell 13 (perhaps 3.3 volts), minus the threshold voltage of the gated selecting transistor (approximately 0.5 volts.) This allows current to flow through selecting transistor 16 and thus buffering transistor 24.

The voltage transmitted to the voltage sensing bus 32 is therefore the DC cell 13 voltage as it drops along the primary signal path through selecting 16 and buffering 24 transistors. Although there is technically no signal flow from the gate 26 of the buffering transistor 24 to the voltage sensing bus 32, or the potential on the photo diode 14 would discharge through the buffering transistor 24, the voltage applied to the bus 32 is, by mathematical necessity, equal to $V_{PD1}$ 34, minus the gate 26 to source 30 voltage drop $V_{GD1}$. Because $V_{GD1}$ is simply a threshold voltage, approximately 0.5 volts, the voltage on the voltage sensing bus 32 can be simply represented as $V_{PD1}$ 34 minus one-half volt. Therefore, although the voltage sensing bus 32 is actually energized from the potential of DC cell 13 as it drops across the selecting and buffering transistors on the primary signal path, the bus 32 voltage is more easily described in terms of $V_{PD1}$ 34 dropping across the threshold voltage $V_{GD1}$. This simpler mathematical model, rather than the actual signal flow, is therefore used hereinafter to describe the potential of the voltage sensing bus. Because the voltage at the cathode 19 of the photodiode 14 is mathematically related to the amount of light which falls on the photodiode 14, the output voltage $V_S$ from the source 30 of the buffering transistor 24 is used to image the darkness or brightness of a single pixel.

The basic operation of a conventional three-transistor imager circuit was first discussed in the IEEE Journal of Solid State Circuits, Vol. SC-5, October 1970, and is also discussed in *Wiles*, et al., Apr. 18, 1995, reissue U.S. Pat. No. 34,908, a reissue of U.S. Pat. No. 5,083,016, the disclosures of which are incorporated herein by reference as if fully set forth.

If, in addition to utilizing the photodiode voltage for imaging an individual pixel, it were used to control flash duration, the photocell could be eliminated without going to the alternative two-flash system. This would eliminate the drawbacks noted in both the photocell and two-flash methods of controlling light exposure. As $V_{PD1}$ 34 decays, the voltage on the voltage sensing bus decays along with it. An op-amp (not shown) could be used to compare the bus voltage to a preset voltage. When the bus voltage falls below the preset voltage, a control signal would be triggered, terminating the photographic development.

Using the light exposure of a single pixel to control flash duration, however, provides a very arbitrary control mechanism. The problem, quite simply, is that a single pixel may or may not be representative of the average light falling on the entire picture. If the pixel being sampled were exposed to a darker portion of the viewing field, such as a shadow, or a wristwatch band, the control signal would not be triggered until the sampled pixel had substantially discharged as a result of light exposure. By that time, the rest of the picture would be grossly overexposed. On the other hand, if the pixel being sampled were exposed to a flash of light reflected off a piece of jewelry, the rapid voltage decay of the photodiode 14 would trigger the control circuitry very quickly. Light exposure would be terminated very early on, and the bulk of the photograph would be grossly underexposed. The resulting photograph would be a dark picture with a glint of light somewhere on it. In short, a single pixel is simply not an adequate representation of the amount of light falling on the imaging surface. If the photocell and two-flash systems are to be replaced by a real time method using light exposure to the imaging surface itself, the entire imaging surface or at least a representative area of the imaging surface, must be used not simply a single pixel.

Averaging the voltages of the various photo diodes in a camera would seem to be a means of approximating the aggregate light which had fallen on the surface of the CMOS imager. Unfortunately, technical hurdles stand in the way of averaging the voltages of a large number of pixels in real time.

FIG. 2 illustrates what happens in a conventional three-transistor imaging circuit when the voltage levels of multiple pixels are read out simultaneously on a voltage sensing bus. The photodiode voltage $V_{PD1}$ 34 on the gate 26 of buffering transistor 24 is one volt. If row selection bus 12 is activated by 3.3 volts, gate 18 is energized, closing selecting transistor 16. As noted above, though there is no current flowing from the photodiode 14 through the gate 26 of the buffering transistor 24, voltage applied to the voltage sensing bus 32 is simply $V_{PD1}$ 34 minus the $V_{GD1}$ 36 threshold voltage (0.5 volts). Accordingly, when $V_{PD1}$ 34 equals 1 volt, the resulting potential on the voltage sensing bus 32 is 0.5 volts.

Similarly, if only the second row selection bus 58 is activated, the voltage applied to the voltage-sensing bus 32 is $V_{PD2}$ 35 minus $V_{GD2}$ 82, which equals 2 volts minus 0.5 volts, or 1.5 volts. Now recalling that the buffering transistors buffer the respective photodiodes, if both row selection busses 12, 58 are activated simultaneously, the voltage sensing bus 32 will assume the highest voltage potential of the two source terminals 30, 74 which are connected to it. In the example depicted in FIG. 2, drain 74 with a 1.5 volt potential would control the voltage potential on the voltage sensing bus 32. Because the bus voltage would degrade in accord with the slowest discharging photodiode, it would remain charged until the last pixel fell below the target voltage. This would ensure that every pixel circuit on that particular voltage sensing bus would be overexposed before the control signal were initiated. Clearly, this approach is unworkable.

Accordingly, voltage sampling from the traditional three-transistor imager circuit is only useful for imaging individual pixels, not for real time shutter control or light control. Traditional photocells must be used to collect light to trigger the control signal terminating the picture development. There is, however, one additional advantage of an electronic imaging surface. It permits a light control by means of an electronic shutter controlling each pixel.

FIG. 3 discloses the circuit of FIG. 1, but with an extra transistor 81 isolating $V_{PD1}$ 34 from the buffering transistor 24. The voltage sensing bus 32 is again used only for transmitting a single voltage of a single pixel for photographic development. The light-exposure control signal is regulated in a traditional manner such as through a photocell. The control signal is applied to the gate 82 of the shutter control transistor 81 typically at the beginning of the integration phase. When gated, the shutter transistor 81 provides a path from $V_{PD1}$ to the gate 26 of the buffering transistor 24. When the electronic shutter is gated, the photodiode $V_{PD1}$ 34 is transferred to the gate 26 of the buffering transistor 24. When the signal controlling the gate 82 of the shutter transistor 81 is reduced to zero volts, the electronic shutter isolates the gate of the buffering transistor from any further voltage degradation of the photodiode.

Once the shutter control transistor opens, further light exposure and accompanying decay of $V_{PD}$ will not be transmitted to the gate 26 of the buffering transistor 24, which will remain at a stable voltage from that time on. If the imaging data is therefore drawn from the voltage potential at the gate 26 of the buffering transistor 24, further decay of $V_{PD}$ will not affect the image. Shutter transistor 81 thereby acts like an electronic shutter for a single pixel.

Although an electronic shutter does not technically terminate light exposure, the phrase "terminating light exposure" or an equivalent phrase is used hereinafter to include any method fixing photographic development, including the electronic shutter.

The electronic imaging circuit thus has a unique advantage over other systems in that it can incorporate an electronic shutter in the basic circuit if desired. Nevertheless, the electronic imaging systems in use are limited to conventional methods of exposure control such as photocells. Attempts to control exposure through the voltage level $V_{PD1}$ of the photodiode 14 remain unworkable. On the one hand, regulating the exposure on the basis of a single diode from a single pixel is hardly a measure of the average light exposure to the entire imaging surface. Overexposed and underexposed photographs become the norm, not the exception. A single pixel is simply not an adequate representation of the average amount of light falling on the imaging surface. On the other hand, it has been noted that it is not possible to aggregate the voltages produced by multiple pixel circuits onto a single voltage sensing bus. A method for summing voltages has long been known in the art through use of an operational amplifier. However, given the number of pixels on the imaging surface of a camera, the cost of using op-amps for summing the voltages produced by all pixel circuits would be prohibitive.

The problem of determining the average total light falling on an imaging surface of an electronic camera remains. The present invention solves this problem.

SUMMARY OF THE INVENTION

The present invention controls light exposure to the CMOS imager within an electronic camera, using the pixel circuitry itself. The output current of a pixel circuit is inversely proportional to the amount of light that has fallen on it. By transmitting the currents of the individual pixels through a common current bus, the instantaneous aggregate current at any one moment is inversely proportional to the total light that has fallen on the CMOS imager. By limiting the maximum current of each pixel, a defective pixel with a thousand times normal conductivity would still have the effect of only a single fully exposed pixel, thereby having a minimal effect on the aggregate current produced by thousands or millions of pixels. Light exposure is optimized by terminating the light exposure to the CMOS imager when the instantaneous aggregate pixel current falls below a preset level.

Because the light exposure to the imaging surface is no longer dependent upon how much light may fall on a single pixel, but on how much light falls on afield of pixels, far better control over the light exposure of the imaging surface is attained. The exposure control of the present invention is compatible with the electronic shutter control being used on cameras using the overflow-drain-current method.

Moreover, the exposure control of the present invention permits processing to enhance the image. For example, current aggregation can be limited to a particular area of the imaging surface, i.e., "spot exposure" by emphasizing a circle centered around the central point of the CMOS imager, thereby optimizing the light exposure for a photographic target in the center of the viewing field. Weighted imaging, mathematically apportioning greater weight to certain areas of the CMOS imager may also be done.

BRIEF DESCRIPTION OF THE DRAWINGS

The exact nature of this invention, as well as its many advantages, will become readily apparent from the following description of the physical embodiment, as illustrated in the accompanying drawings, in which like reference numerals designate like parts throughout the figures thereof, and wherein.

DETAILED DESCRIPTION OF THE PREFERRED EMBODIMENTS.

Figure 1:
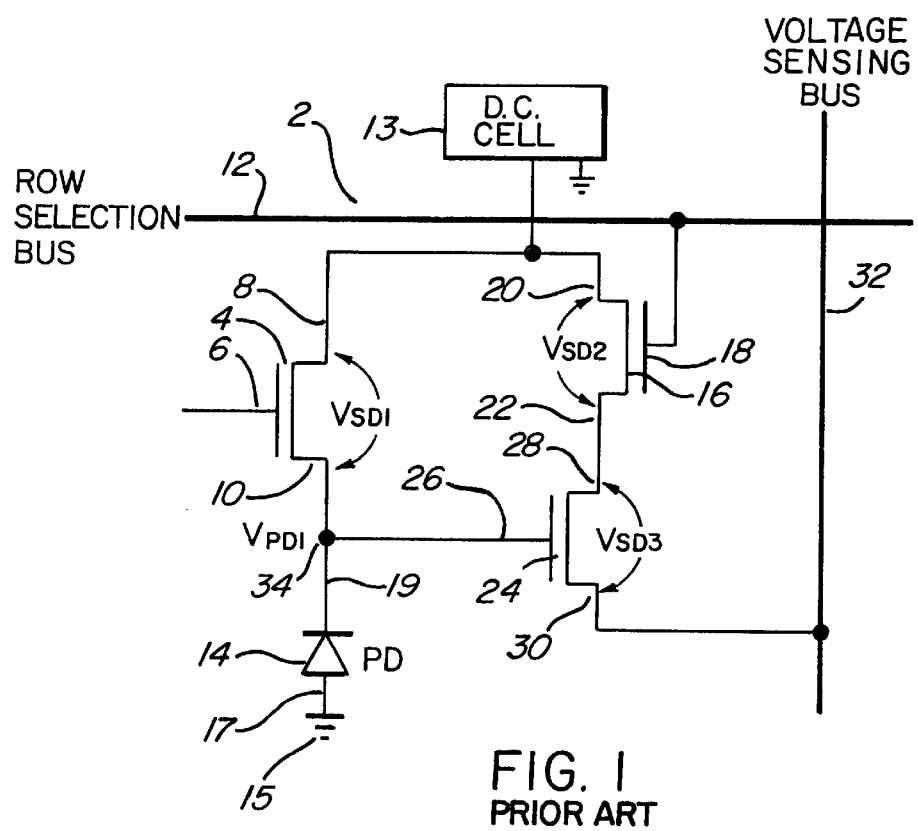
FIG. 1 is a circuit diagram of a typical three-transistor image circuit.
Figure 3:
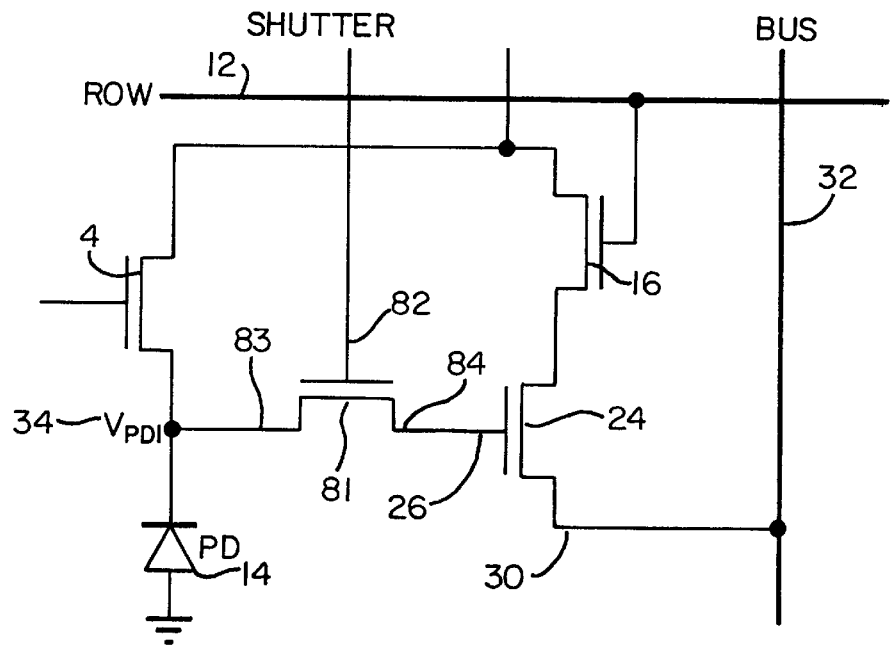
FIG. 3 is a circuit diagram of a three transistor image circuit with an additional shutter transistor.
Figure 2:
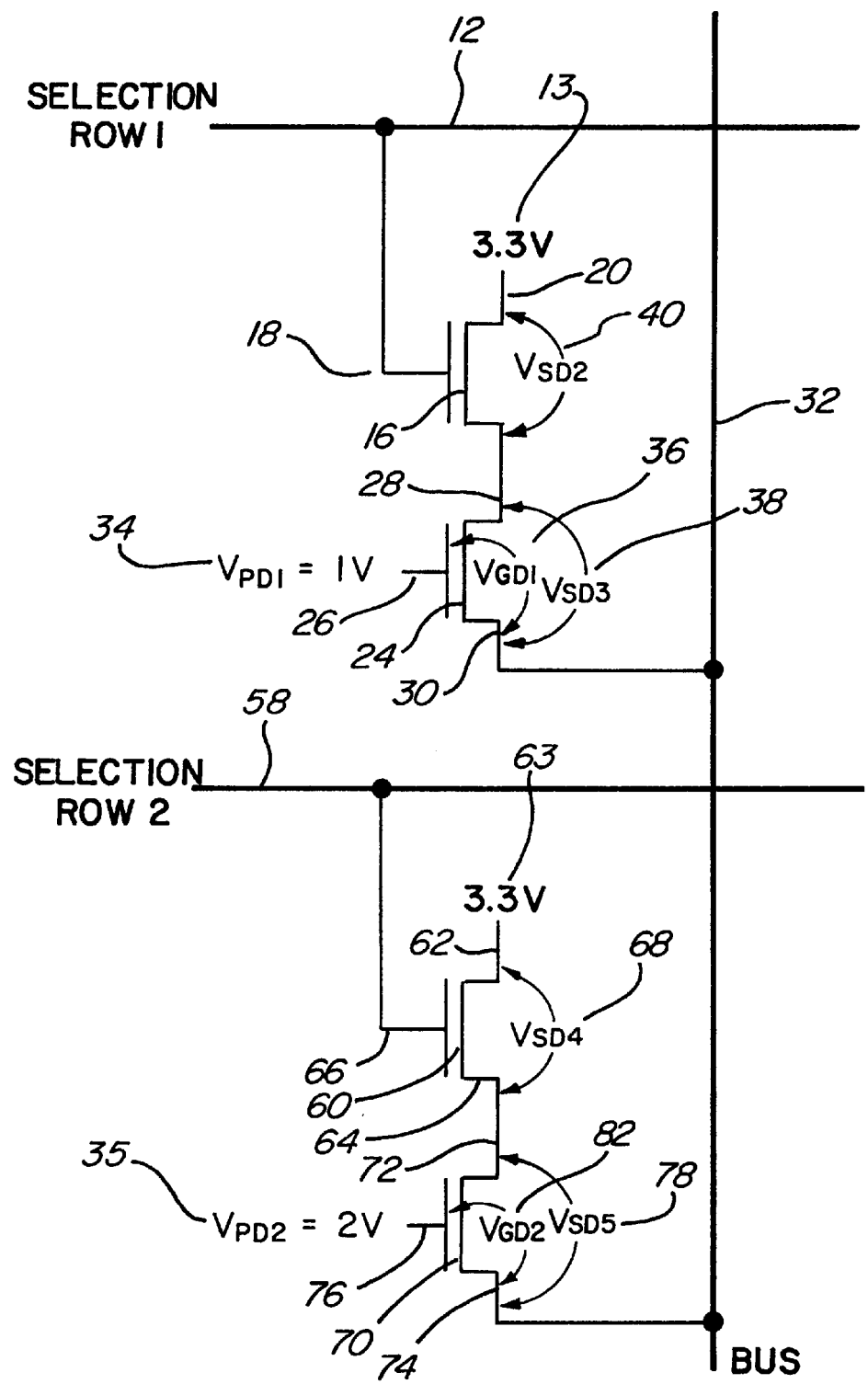
FIG. 2 circuit diagram of a multiple pixel transistor image circuit.
Figure 4:
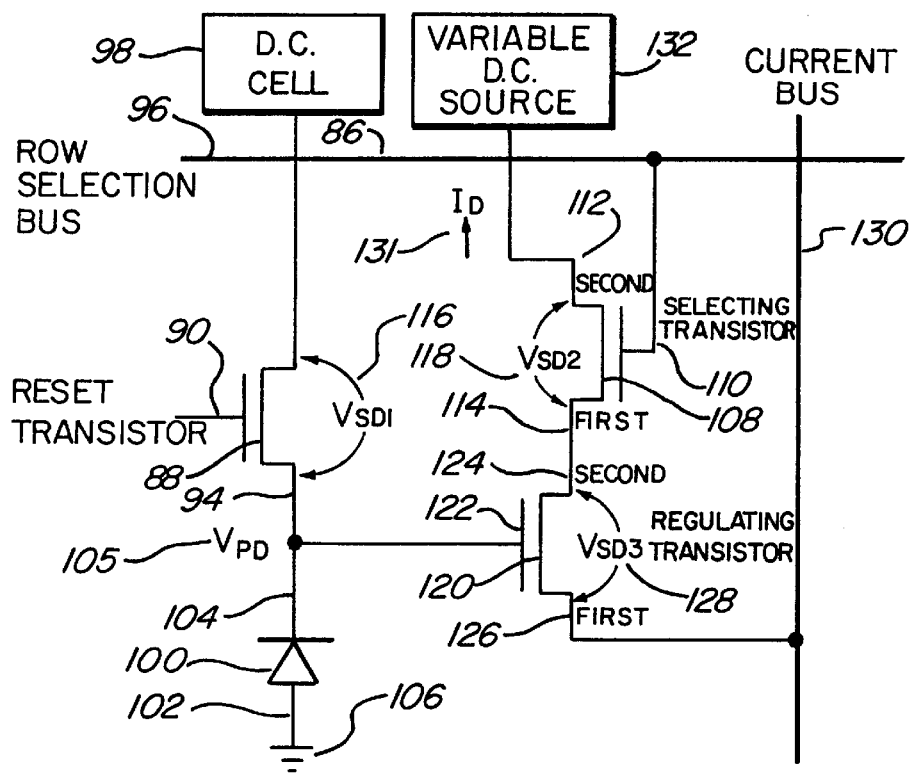
FIG. 4 is a circuit diagram of a preferred embodiment of the present invention.

FIG. 4 is a modified active pixel sensor circuit according to the present invention through which the total photon bombardment on the CMOS imager, or a pre-selected or weighted field on the CMOS imager, may be measured. The circuit follows the basic design of a conventional three transistor imaging circuit of FIG. 1, except that the voltage source 132 applied to the second terminal 112 of the selecting transistor 108 is a variable DC signal which can be reduced from a high voltage level of approximately 3 to 5 volts or 1.5 to 6 volts, to a low voltage level 0 to 0.5 volts, to zero volts. Once the potential of the variable DC source 132 is reduced to zero, instead of producing a voltage, the circuit now produces a current inversely proportional to the charge VPD 105 at the cathode 104 of photo diode 100. Unlike voltages, currents can be aggregated. By aggregating the currents of select pixels, the amount of light falling on the entire imaging surface, or a selected area of the imager, is used to trigger the control signal for terminating the light exposure.

The image processing starts with the reset phase. DC cell 98 typically comprises a voltage from 3.3 to 5 volts which drops to ground 106 across the reset-transistor 88 and a photo diode 100. Initially, no voltage is applied to the gate 90 of the reset transistor, and the reset transistor 88 acts as an open circuit. In the second step, a pulse on the gate 90 of the reset-transistor 88 gate reduces the voltage drop $V_{SD1}$ 116 across the reset transistor to the threshold voltage $V_t$ of the transistor, typically about 0.5 volts. The voltage drop across the photo diode $V_{PD}$ thereby becomes the potential of the DC cell 98 minus $V_t$. For example, a 5 volt cell voltage minus a threshold voltage of 0.5 volts, results in a of 4.5 volt potential across photodiode 100.

In the third step, the reset pulse is terminated. This insures that any charge that drains off of the photodiode 100 in the integration phase will not be replaced by DC cell 98. Because of the inherent capacitance of a photo diode, however, photo diode 100 will retain this charge for a period of time after the reset pulse stops.

The next step is the integration phase, the exposure of light onto the CMOS imager which exposes the photodiode of each pixel to light. As a result of photon bombardment, the charge stored in the photodiode drains from its cathode 104 toward ground 106, and $V_{PD}$ 105 approaches zero.

Accordingly, $V_{PD}$ 105 is inversely proportional to the total light that has fallen on the diode 100 from the moment the reset pulse terminated.

In order to determine the aggregate light falling on a predetermined area of the CMOS imager, each pixel circuit must be designed to produce a current mathematically related to the voltage $V_{PD}$ 105 of the photodiode 100. Inasmuch as $V_{PD}$ 105 is mathematically related to photon bombardment, if a current can be generated that is mathematically related to $V_{PD}$ 105, it will also be mathematically related to total photon bombardment.

A selecting transistor 108 is configured such that its gate 110 is operatively connected to a row selection bus 96. At different points in the operation of the circuit, different voltages will be applied to the second terminal 112 of the selecting transistor 108. A variable voltage source can be achieved through a DC cell 132 which is inherently capable of delivering variable levels of voltage (typically a high voltage from 3.3 volts to 5 volts and a low of zero volts), or by switching from a fixed high voltage source, such as DC source 98, to a low voltage source, such as ground 106. The preferred embodiment shown in FIG. 4 discloses a variable DC cell 132. When the high voltage potential is applied to the second terminal of selecting transistor 108, the second terminal acts as a drain. When the variable DC cell 132 potential is reduced to zero, the second terminal 112 acts as a source. The first terminal 114 of the selecting transistor 108 is operatively connected to the second terminal 124 of the regulating/buffering transistor 120. The first terminal 126 of the regulating/buffering transistor 120 is operatively connected to the current bus 130. The gate 122 of regulating/buffering transistor 120 is operatively connected to the cathode 104 of the photodiode 100.

In the final step of producing a regulated current mathematically related to the voltage potential of the photodiode 100, the current bus 130 must be set to a positive voltage, typically 0.5 volts below the DC cell battery 98, and the voltage potential at the second terminal 112 of the selecting transistor 108 is switched from its high voltage (typically 3.3 volts) to its low voltage (typically zero volts). The desired current flow will not occur until this voltage shift takes place. This voltage switch must take place before the optimum amount of light has fallen on the CMOS imager. Preferably, this voltage switch occurs at the beginning of the integration phase.

Recalling that the voltage in a closed loop must be zero, and using the zero potential variable DC source 132 as a ground or reference, the voltage potential of the current bus must be equal to the combined source-to-drain voltage drops across the selecting 108 and buffering 120 transistors. Accordingly, as the source-to-drain voltage $V_{SD3}$ across the buffering transistor 120 increases, the source-to-drain voltage drop $V_{SD2}$ across the selecting transistor 108 must decrease. The total voltage drop remains constant. When the photo diode 100 is at its maximum charge, the source-to-drain voltage drop $V_{SD3}$ 128 across the buffering transistor 120 is at its lowest. It is at this time therefore that the source-to-drain voltage drop $VSD_2$ 118 across the selecting transistor 108 is greatest. Accordingly, the voltage drops across both the buffering 120 and selecting 108 transistors are mathematically related to voltage $V_{PD}$ 105 on the gate 122 of the buffering transistor 120. The source-to-drain voltage $V_{SD\ 2}$ 118 across the selecting transistor 108 is therefore directly proportional to the photodiode voltage $V_{PD}$ 105. This provides a means of controlling the current through the primary current path which is also directly proportional to the photodiode voltage $V_{PD}$ 105. The term "directly proportional" as used herein is used interchangeably with the term "linear," and includes the possibility of an offset, such as the "b" term in the linear equation y=k x+b.

Figure 5:
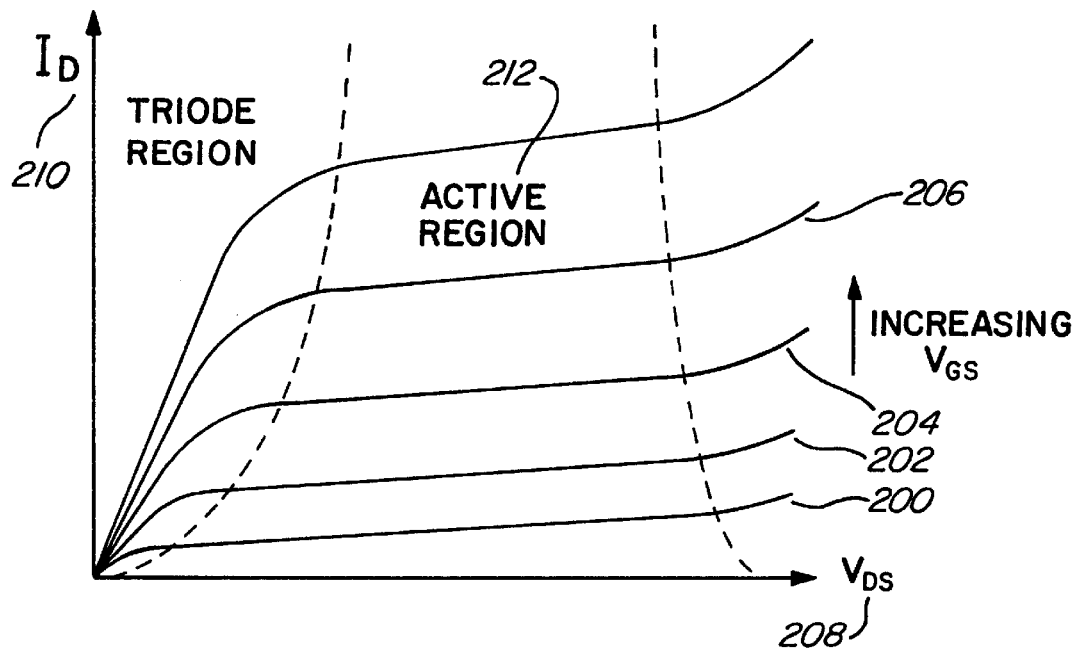
FIG. 5 is a graph showing drain voltage to drain current characteristics of a selecting transistor for various gate voltages.

FIG. 5 discloses a series of parallel curves 200, 202, 204, 206 which represent behavioral characteristics at different gate-to-source voltages on the selecting transistor. At a particular gate-to-source voltage 204, it is observed that within the "active region" 212, the curve is basically linear, establishing a relationship of direct proportionality between the drain-to-source voltage 208 of the horizontal axis and the drain-to-source current 210 of the vertical axis. The slope however is not zero. Within the active region, as the source-to-drain voltage $V_{DS}$ 208 increases along the horizontal axis, there is also an increase in source-to-drain current $I_D$ 210 along the vertical axis. $I_D$ 210, in FIG. 5, corresponds to the current which passes through the primary current path of FIGS. 4 and 6.

Figure 6:
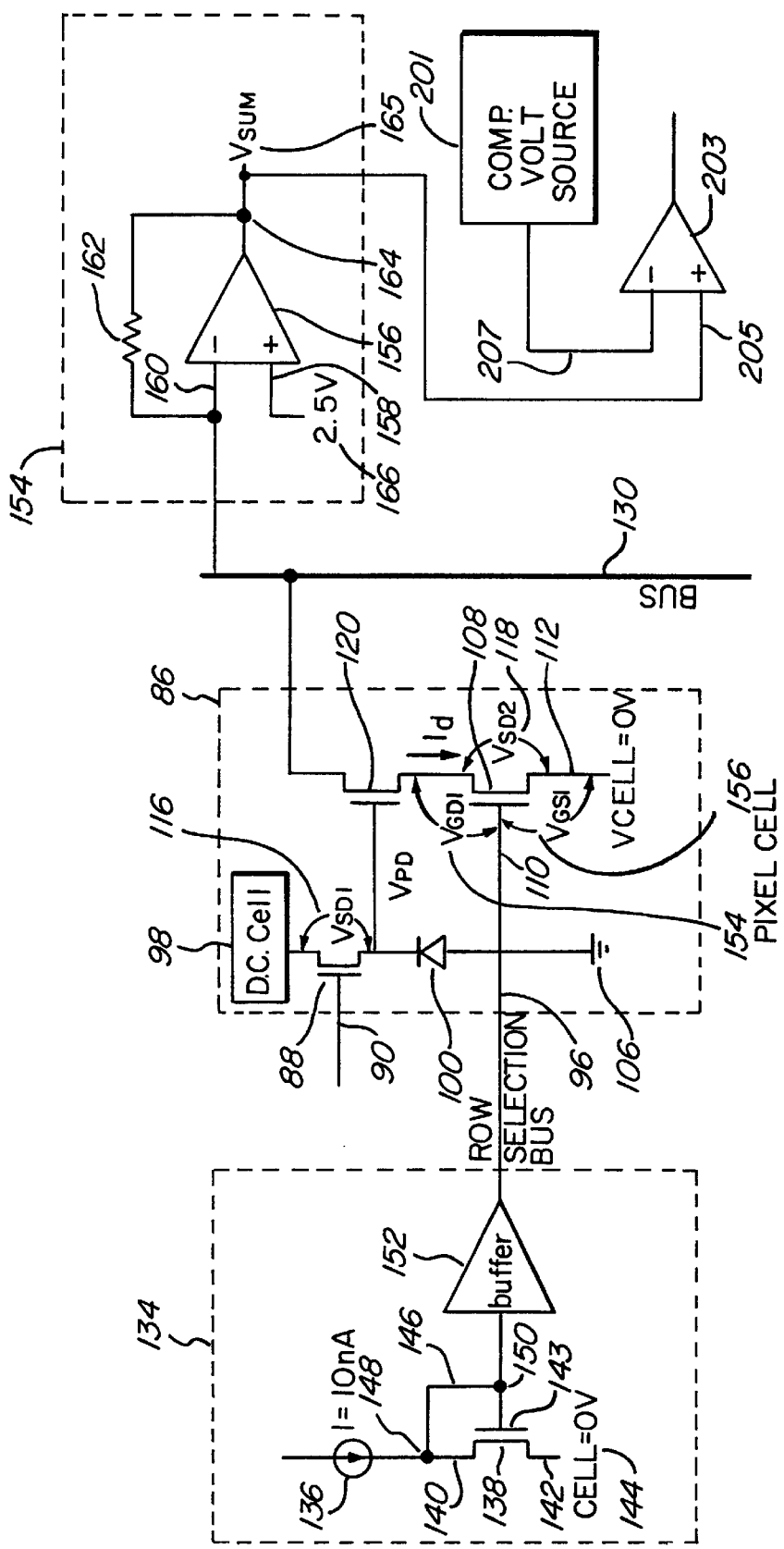
FIG. 6 is a circuit diagram of a preferred embodiment of the present invention.

FIG. 6 conceptually represents the circuit of FIG. 4 (with transistors 120 and 108 reoriented) during the integration phase when the variable DC cell 132 (FIG. 4) has been reduced from approximately 3.3 volts to zero volts. When the DC cell 132 voltage is reduced to zero, there is a functional reversal between the source and drain of the selecting 108 and regulating/buffering 120 transistors. Because the second or source terminal 112 of the selecting transistor 108 is now at zero volts, the gate-to-source voltage $V_{GS1}$ 156 of the selecting transistor simply equals the gate voltage 110. Therefore, a constant gate 110 voltage on the selecting transistor 108 during the integration phase will produce a constant gate-to-source voltage. It will be recalled from FIG. 5 that a constant gate-to-source voltage produces a linear relationship between the drain-to-source voltage $V_{DS}$ 208 and current $I_D$ 210 within the active region. Accordingly, in FIG. 6, a constant gate voltage 110 on the selecting transistor 108 will maintain a linear relationship between the source-to-drain voltage $V_{SD2}$ 118 and the current passing through that same path. It was earlier demonstrated that the drain-to-source voltage $V_{DS2}$ 118 of the selecting transistor is directly proportional to the photo diode voltage $V_{PD}$ 105. Accordingly, the current through the primary current path of the circuit in FIGS. 4 and 6 is proportionally to voltage variations within $V_{PD}$ 105.

Since $V_{PD}$ is inversely proportional to the amount of light which has fallen on the photo diode from the time the integration phase began, the current allowed to pass through buffering transistor 120 also bears an inverse linear relationship to the amount of light that has fallen on the photodiode 100.

FIG. 6 illustrates a current mirror circuit 134 connected to the pixel cell.

Current mirrors are known to those skilled in the art as a means of establishing a nominal current in an adjacent circuit. A fixed current 136 in the 10 nA range is channeled into the drain 140 of the current mirror transistor 138. A shunt 146 attaches from a first point 148 on the drain 140 to a second point 150 on the gate 143, forming a short circuit between the drain 140 and gate 143. The source 142 is connected to a referenced zero volt potential of a DC cell 144, forming a completed circuit for the 10 nA current to pass.

Because of the short circuit, the current mirror transistor becomes self-regulating through feedback. This can be illustrated by considering what would happen if the current through the current mirror transistor 138 were ever different than the source current of 10 nA. If the voltage drop from drain 140 to source 142 were greater than the voltage producing a constant current, the electromotive force of the constant current source would be insufficient to maintain any current flow through the transistor. Because the current would nevertheless be constant from a constant current source, the charge would choose an alternate path, flowing across the short circuit 146 to the transistor gate 143. The accumulation of charge at the gate 143 would increase the voltage potential on the gate. The higher voltage of the gate would, in turn, reduce the source-to-drain 140, 142 voltage drop of the current mirror transistor 138, allowing current to again flow. On the other hand, if the source-to-drain voltage of the current mirror transistor 138 were to drop below the voltage supplied by the constant current source, more current would have to cross the source-to-drain path than could be supplied by the constant current source. The electron flow would come from the gate 143 by means of the short circuit 146. This outflow of electrons would reduce the voltage potential of the gate, which would translate to a greater source-todrain voltage across the transistor 138. That voltage would increase until it were in equilibrium with voltage representing the fixed 10 nA current source. In this way, the circuit 134 is self regulating, and maintains a steady voltage on the gate 143.

The row selection bus 96 connects the gate 143 of the current mirror transistor 138 to the gate 110 of the selecting transistor 108, resulting in an identical voltage potential on both gates. Because the source terminals 142, 112 of both the current mirror transistor 138 and the selecting transistor 108 are at zero volt potential, and the gates are at equal potential, the gate-to-source voltages are identical. Both of these transistors are selected for operating characteristics disclosed in the active region of FIG. 5. As previously noted, by maintaining a constant gate-to-source voltage on the gate of the selecting transistor 108, the current flow through the primary current path will be inversely proportional to the amount of light that has fallen on the photodiode during the integration phase, when $V_{PD}$ is greatest immediately after reset, when the photodiode 100 is charged, and the attendant gating on the buffering transistor is the greatest, and the current level through the primary current path is greatest. As photon bombardment degrades the voltage potential of the photodiode 100, current $I_d$ is progressively reduced.

FIG. 6 also shows a current measuring circuit 154 which sums the aggregate currents produced by select pixels. The current measuring circuit 154 comprises a first op-amp 156 with an inverting input 160, a non-inverting input 158, an output 164, and a resistor 162 shunted from the inverting input 160 to the output 164. The use of an op-amp to take the summation of currents $I_T$ from the bus 130, and convert that total amperage to an output voltage is commonly known to those skilled in the art. The value of the resistor 162 shunted from the inverting input to the output is pre-selected to produce a gain which falls within certain measurable parameters.

The output voltage $V_{sum}$ 165 of the first op-amp is compared to a preset voltage, typically by means of second op-amp 203. A comparative voltage source 201 generates a preset voltage which is channeled into the inverting input of the second op-amp 203, and the output of the first op-amp 156 is channeled into the non-inverting input of the second op-amp 203. The output of the second op-amp 203 may either be used as a control signal which terminates light exposure when $V_{sum}$ 165 reaches the preset voltage, or it may be operatively channeled to a separate control circuit which generates the control signal for terminating light exposure. By utilizing an adjustable comparative voltage generator capable of generating a range of preset voltages 1.5 to 5 volts, the photographer has the ability to increase or decrease the light exposure of a given picture to accommodate various photographic objectives.

Figure 7:
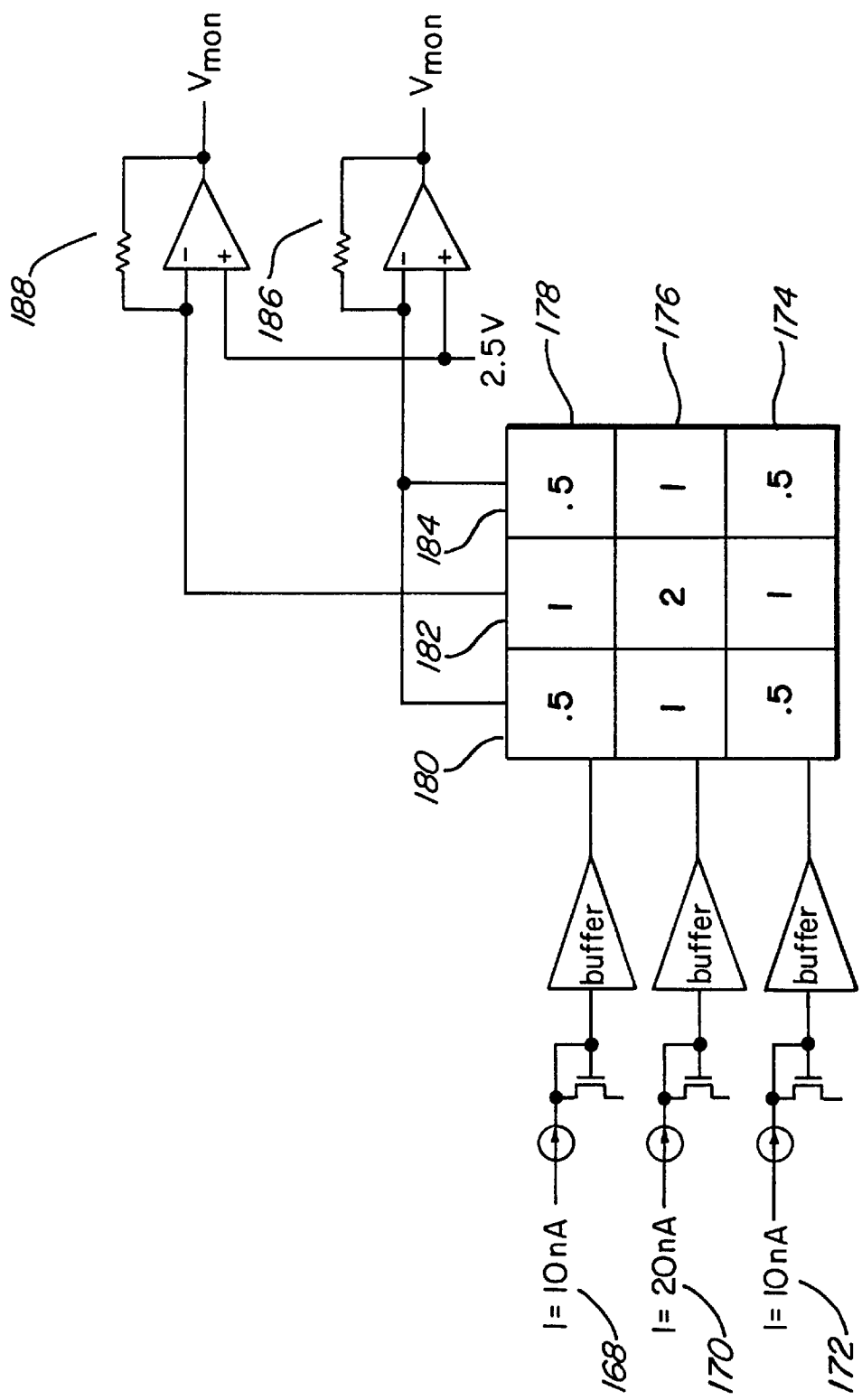
FIG. 7 is an illustration of a preferred weighting scheme that may be utilized with the present invention.

Because the field of a camera is typically centered on the object of greatest photographic importance, assigning different "weights" to different sectors of the imaging surface can often enhance the quality of a photograph by optimizing light exposure for the most important part of the viewing field. If different objects or sections within the field of vision of the camera reflect different amounts of light, greater priority can be given to the center of the picture field, and less priority to the corners or edges. FIG. 7 illustrates a center weighting scheme wherein the center of the field is given a relative weight of two, the edges a weight of one, and the corners a weight of one-half. Rows 168, 170 and 172 intersect columns 180, 182 and 184 to define a matrix of sectors. Different current mirror circuits 168, 170, 172 respectively controlling rows 178, 176, and 174 are assigned different nominal currents. The aggregate currents of all the pixel sensor circuits within a column are collected onto a current bus and channeled to an op-amp for processing. In order to give distinct "weights" to separate columns, each column is assigned to a specific op-amp of a predetermined gain parameter. FIG. 7 illustrates the currents from columns 180 and 184 being combined and processed by op-amp 186, since the predetermined gain for both columns was identical. The current from column 182 processed by op-amp 188.

The relative "weight" given to each sector can be calculated by multiplying the nominal current of that sector's row times the relative gain of the op-amp assigned to that sectors column. As is commonly known in the art, the separate voltage outputs can easily be summed by a third op-amp (not shown).

A similar process can be used in "spot exposure", wherein the photographer selects only one sector of the imaging surface (typically a center section) for generating the control signal to terminate light exposure. If applied to FIG. 7, the nominal current in current mirror circuits 168 and 172 would be reduced to zero amperes. Similarly, a switch would disconnect the output of op-amp 186 from any further signal analysis or integration. With only the center row 176 being activated by current mirror circuit 170, and only the current from the center column 182 being processed by op-amp 188, only the center sector of the imaging surface would be used in evaluating light exposure to the imaging surface.

Because the total current produced by center weighting or spot exposure is typically less than the aggregate current produced by the entire imaging surface, the voltage-preset-voltage for triggering the control signal must be reduced proportionately, or the reference current for the center area could be increased, alternatively.

What is claimed is:

1. An active pixel sensor circuit which produces a current component mathematically related to photon bombardment, said sensor circuit comprising:
   a light accumulation circuit which produces a voltage component mathematically related to a cumulative amount of light which has fallen on a light sensitive component within the light accumulation circuit;
   a variable DC power source capable of providing at least two voltage potentials, a first potential in the range of zero to 0.5 volts, and a second potential in the range of 1.5 to 6 volts;
   a selecting transistor comprising a first terminal, a second terminal and a gate, the second terminal of the selecting transistor being connected to the variable DC power source;
   a current regulating transistor comprising a first terminal a second terminal, and a gate, the gate operatively connected to the light accumulation circuit, the second terminal operatively connected to the first terminal of the selecting transistor, and the first terminal operatively connected to a current bus;
   a current mirror transistor comprising a source, a drain, and a gate;
   a current source operatively connected to the source of the current mirror transistor;
   a terminal of 0 to 0.5 volt potential operatively connected to the drain of the current mirror transistor;
   a conductive link operatively connecting the drain and the gate of the current mirror transistor;
   the sate of the current mirror transistor is operatively connected to the row selection bus; and
   a row selection bus operatively connecting the current mirror circuit to the gate of the selecting transistor, the row selection bus including a buffer between the gate of the selecting transistor and the gate of the current mirror transistor.

2. The active pixel sensor circuit of claim 1 further comprising a current measuring circuit, the current bus operatively connecting the current measuring circuit to the current conversion circuit.

3. The active pixel sensor circuit of claim 1, the light accumulation circuit comprising:
   a first DC power source capable of providing DC power in a 1.5 to 6 volt range;
   a reset transistor comprising a source, a drain and a gate, the source being operatively connected to the first DC power source;
   a photodiode comprising an anode and a cathode, the cathode of the photodiode being operatively connected to the drain of the reset transistor and to the current conversion circuit; and
   a ground potential operatively connected to the anode of the photodiode.

4. An active pixel sensor circuit which produces a current component mathematically related to photon bombardment, said sensor circuit comprising:
   a light accumulation circuit which produces a voltage component mathematically related to a cumulative amount of light which has fallen on a light sensitive component within the light accumulation circuit;
   a current conversion circuit operatively connected to the light accumulation circuit, the said current conversion circuit designed to convert the voltage component of the light accumulation circuit into a current component;
   a current bus operatively connected to the current conversion circuit;
   an op-amp comprising an inverting input, a non-inverting input and an output, said inverting input being operatively connected to the current bus;
   a fixed voltage in the range of 1.5 and 5 volts operatively applied to the non-inverting input;
   a resistor of a predetermined value connected between the output and the inverting input; and
   a second op-amp and a comparative voltage source, the second op-amp comprising an inverting input operatively connected to the comparative voltage source, a non-inverting input operatively connected to the output of the first op-amp, and an output.

5. The active pixel sensor circuit of claim 4 wherein a voltage setting of the comparative voltage source may be adjustably selected by a user.

6. An electronic camera, including an imaging surface defined by columns, rows and sector, an intersection of one column and one row forming one sectors each sector comprising;
   a plurality of active pixel sensor circuits, each including a light sensitive element and producing an electrical current mathematically related to photon bombardment upon the light sensitive element;
   a plurality of current mirror circuits respectively coupled to the plurality of active pixel sensor circuits, said current mirror circuits independently capable of variable current levels; and
   a plurality of operational amplifiers, and wherein the electrical currents produced by pixel sensor circuits within a same row are channeled to an operational amplifier by means of a current bus.

7. The electronic camera of claim 6 further comprising a current bus.

8. The electronic camera of claim 7 further comprising an op-amp having an inverting input, a non-inverting input and an output, said inverting input being connected to the current bus.

9. The electronic camera of claim 8 further comprising a voltage in the range of 1.5 and 5 volts applied to the non-inverting input.

10. The electronic camera of claim 9 further comprising a resistor of a predetermined value connected between the output and the inverting input.

11. The electronic camera of claim 6 wherein one or more of the active pixel sensor circuits further comprise a variable DC power source providing at least two voltage potentials, a first potential in the range of zero to 0.5 volts, and a second potential in the range of 1.5 to 6 volts.

12. The electronic camera of claim 11 wherein one or more of the active pixel sensor circuits further comprise a selecting transistor that includes a first terminal, a second terminal and a gate, the second terminal of the selecting transistor being connected to the variable DC power source.

13. The electronic camera of claim 12 wherein one or more of the active pixel sensor circuits further comprise a current regulating transistor that includes a first terminal, a second terminal and a gate, the gate connected to the light accumulation circuit, the second terminal connected to the first terminal of the selecting transistor, and the first terminal connected to a current bus.

14. The electronic camera of claim 6 wherein one or more of the current mirror circuits further comprise a current mirror transistor comprising a source, a drain, and a gate.

15. The electronic camera of claim 14 wherein one or more of the current mirror circuits further comprise a current source connected to the source of the current mirror.

16. The electronic camera of claim 15 wherein one or more of the current mirror circuits further comprise a terminal of 0 to 0.5 volt potential connected to the drain of the or transistor.

17. The electronic camera of claim 16 wherein one or more of the current mirror circuitits further comprise a conductive link connecting the drain and the gate of the current mirror transistor.

18. The electronic camera of claim 17 wherein one or more of the current mirror circuits further comprise the gate of the current mirror transistor connected to the row selection bus.

19. The electronic camera of claim 18 wherein one or more of the current mirror circuits further comprise a row selection bus connecting the current mirror circuit to the gate of the selecting transistor, the row selection bus including a buffer between the gate of the selecting transistor and the gate of the current mirror transistor.

* * * * *